(12) United States Patent
Song et al.

(10) Patent No.: US 10,297,644 B2
(45) Date of Patent: May 21, 2019

(54) ORGANIC LIGHT EMITTING DIODE DISPLAY DEVICE

(71) Applicant: SAMSUNG DISPLAY CO., LTD., Yongin-si, Gyeonggi-do (KR)

(72) Inventors: Hajin Song, Yongin-si (KR); Byeongwook Yoo, Yongin-si (KR); Jihwan Yoon, Yongin-si (KR); Jaehoon Hwang, Yongin-si (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/700,549

(22) Filed: Sep. 11, 2017

(65) Prior Publication Data

US 2018/0076267 A1  Mar. 15, 2018

(30) Foreign Application Priority Data

Sep. 12, 2016 (KR) .......................... 10-2016-0117341

(51) Int. Cl.
```
H01L 27/32      (2006.01)
H01L 51/50      (2006.01)
H01L 51/52      (2006.01)
G09G 3/3225     (2016.01)
G09G 3/3233     (2016.01)
```

(52) U.S. Cl.
CPC ........ *H01L 27/3211* (2013.01); *G09G 3/3225* (2013.01); *H01L 27/326* (2013.01); *H01L 27/3246* (2013.01); *H01L 51/5265* (2013.01); *G09G 3/3233* (2013.01); *G09G 2300/0426* (2013.01); *G09G 2300/0439* (2013.01); *H01L 51/5096* (2013.01); *H01L 2251/558* (2013.01)

(58) Field of Classification Search
USPC .......................................................... 257/40
See application file for complete search history.

(56) References Cited

U.S. PATENT DOCUMENTS

| | | | |
|---|---|---|---|
| 8,907,330 B2 | 12/2014 | Im et al. | |
| 9,006,713 B2 | 4/2015 | Park et al. | |
| 9,048,456 B2 | 6/2015 | Chang et al. | |
| 9,293,732 B2 | 3/2016 | Pyo et al. | |

(Continued)

FOREIGN PATENT DOCUMENTS

| KR | 10-2013-0007307 A | 1/2013 |
|---|---|---|
| KR | 10-2013-0007308 A | 1/2013 |

(Continued)

*Primary Examiner* — Thien F Tran
(74) *Attorney, Agent, or Firm* — Lee & Morse, P.C.

(57) ABSTRACT

An OLED display device includes a substrate including red, green, and blue pixel areas, a first electrode at each of the red pixel area, the green pixel area, and the blue pixel area on the substrate, a hole transport layer on the first electrode, a light emission portion on the hole transport layer, the light emission portion including a red light emitting layer at the red pixel area, a green light emitting layer at the green pixel area, and a blue light emitting layer at the blue pixel area, a first charge generation layer and a first resonance auxiliary layer between the hole transport layer and the blue light emitting layer, a second resonance auxiliary layer between the hole transport layer and the red light emitting layer, an electron transport layer on the light emission portion, and a second electrode on the electron transport layer.

15 Claims, 5 Drawing Sheets

(56) References Cited

U.S. PATENT DOCUMENTS

| | | | |
|---|---|---|---|
| 9,312,309 B2 | 4/2016 | Im et al. | |
| 2013/0140533 A1* | 6/2013 | Lee .................... | H01L 51/5265 |
| | | | 257/40 |
| 2014/0027732 A1* | 1/2014 | Pyo ...................... | H01L 51/506 |
| | | | 257/40 |
| 2016/0056214 A1* | 2/2016 | Pyo .................... | H01L 27/3211 |
| | | | 257/40 |
| 2016/0190501 A1 | 6/2016 | Kim et al. | |
| 2017/0033306 A1 | 2/2017 | Song et al. | |

FOREIGN PATENT DOCUMENTS

| | | |
|---|---|---|
| KR | 10-2013-0092725 A | 8/2013 |
| KR | 10-2014-0032628 A | 3/2014 |
| KR | 10-2014-0095180 A | 8/2014 |
| KR | 10-2016-0078782 A | 7/2016 |
| KR | 10-2017-0015620 A | 2/2017 |

* cited by examiner

ORGANIC LIGHT EMITTING DIODE DISPLAY DEVICE

CROSS-REFERENCE TO RELATED APPLICATION

Korean Patent Application No. 10-2016-0117341, filed on Sep. 12, 2016, in the Korean Intellectual Property Office (KIPO), and entitled: "Organic Light Emitting Diode Display Device," is incorporated by reference herein in its entirety.

BACKGROUND

1. Field

Embodiments relate to an organic light emitting diode ("OLED") display device.

2. Description of the Related Art

Display devices include a liquid crystal display ("LCD") device, an organic light emitting diode ("OLED") display device, a plasma display panel ("PDP") device, an electrophoretic display ("EPD") device, and the like, each having a respective light emitting scheme.

Among those types of display devices, OLED display devices are garnering attention as an ideal next generation display device because they have excellent display characteristics in terms of a contrast ratio and a response time, and are advantageous in implementing a flexible display device.

The above information disclosed in this Background section is only for enhancement of understanding of the background of the inventive concept, and, therefore, it may contain information that does not form the prior art that is already known in this country to a person of ordinary skill in the art.

SUMMARY

Embodiments are directed to an organic light emitting diode display device, including a substrate including a red pixel area, a green pixel area, and a blue pixel area, a respective first electrode at each of the red pixel area, the green pixel area, and the blue pixel area on the substrate, a hole transport layer on the first electrode, a light emission portion on the hole transport layer, the light emission portion including a red light emitting layer at the red pixel area, a green light emitting layer at the green pixel area, and a blue light emitting layer at the blue pixel area, a first charge generation layer and a first resonance auxiliary layer between the hole transport layer and the blue light emitting layer, a second resonance auxiliary layer between the hole transport layer and the red light emitting layer, an electron transport layer on the light emission portion, and a second electrode on the electron transport layer. A distance between the first electrode and the second electrode at the blue pixel area may be greater than a distance between the first electrode and the second electrode at the red and green pixel areas.

The distance between the first electrode and the second electrode at the red pixel area may be in a range of about 1000 Å to about 1200 Å, the distance between the first electrode and the second electrode at the green pixel area may be in a range of about 800 Å to about 1000 Å, and the distance between the first electrode and the second electrode at the blue pixel area may be in a range of about 1700 Å to about 1900 Å.

The organic light emitting diode display device may further include a third resonance auxiliary layer between the hole transport layer and the green light emitting layer.

The first charge generation layer may contact the hole transport layer.

The organic light emitting diode display device may further include a second charge generation layer between the first charge generation layer and the blue light emitting layer.

The first charge generation layer may not contact the hole transport layer.

The first charge generation layer may have a thickness in a range of about 30 Å to about 800 Å.

The first charge generation layer may be a p-type doped layer.

The first charge generation layer may include 1,4,5,8,9,11-hexaazatriphenylene-hexacarbonitrile.

The organic light emitting diode display device may further include a third charge generation layer between the first electrode and the hole transport layer.

The organic light emitting diode display device may further include a hole injection layer between the first electrode and the hole transport layer.

The organic light emitting diode display device may further include a fourth charge generation layer between the hole injection layer and the hole transport layer.

The organic light emitting diode display device may further include a first buffer layer between the blue light emitting layer and the electron transport layer.

The first buffer layer may have a thickness in a range of about 30 Å to about 100 Å.

The organic light emitting diode display device may further include a second buffer layer between the red light emitting layer and the electron transport layer, between the green light emitting layer and the electron transport layer, and between the first buffer layer and the electron transport layer.

BRIEF DESCRIPTION OF THE DRAWINGS

Features will become apparent to those of skill in the art by describing in detail example embodiments with reference to the attached drawings in which.

DETAILED DESCRIPTION

Figure 1:
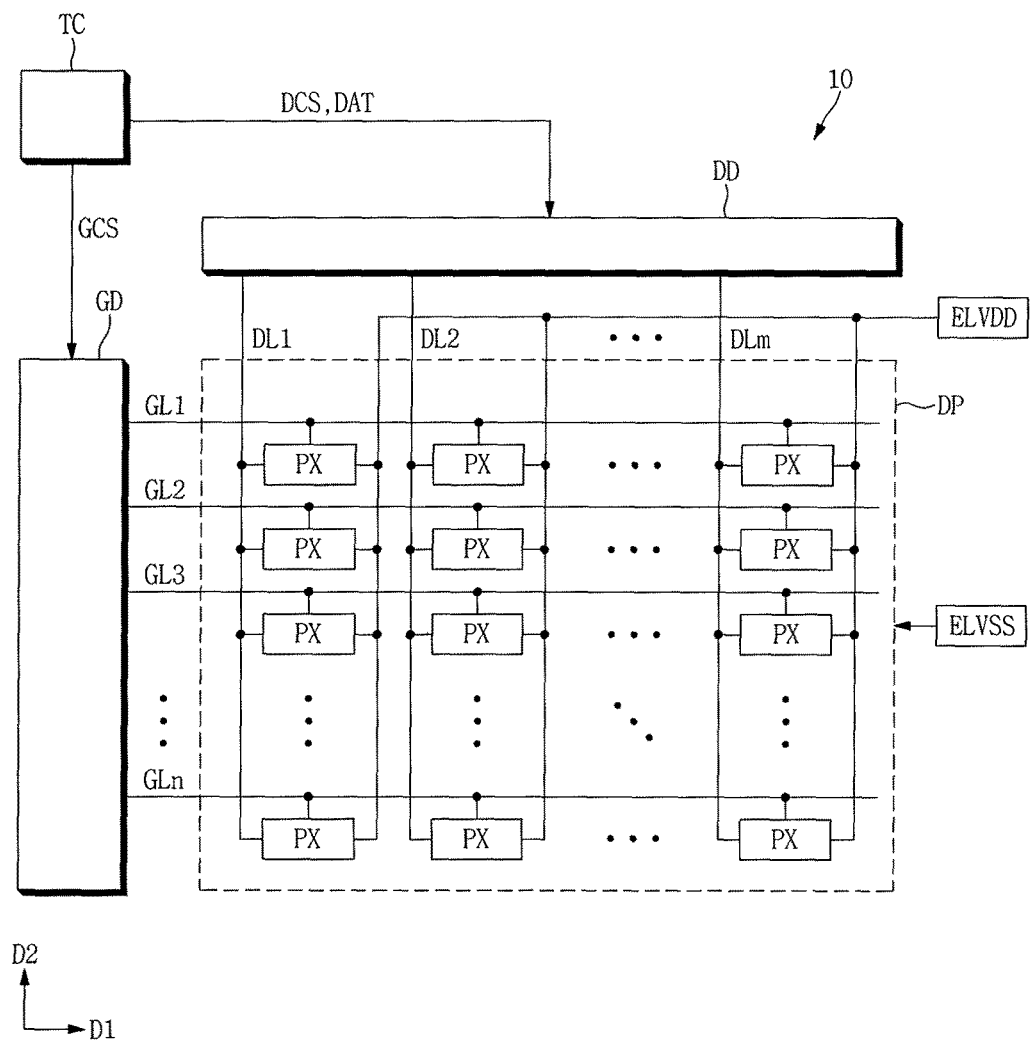
FIG. 1 illustrates a block diagram illustrating an organic light emitting diode ("OLED") display device according to a first example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, a first example embodiment will be described with reference to FIGS. 1, 2 and 3.

FIG. 1 is a block diagram illustrating an organic light emitting diode ("OLED") display device 10 according to a first example embodiment.

Referring to FIG. 1, the OLED display device 10 according to the first example embodiment includes a display panel DP, a timing control unit TC, a gate driving unit GD, and a data driving unit DD.

In the present example embodiment, the timing control unit TC receives an image data externally applied thereto and outputs, to the data driving unit DD, an image data signal DAT suitably converted in accordance with an operation mode of the display panel DP. In addition, the timing control unit TC generates a gate driving control signal GCS and a data driving control signal DCS using horizontal and/or vertical synchronization signals and a clock signal and applies the gate driving control signal GCS and the data driving control signal DCS to the gate driving unit GD and the data driving unit DD, respectively.

The gate driving unit GD receives the gate driving control signal GCS from the timing control unit TC and generates a plurality of gate signals. The plurality of gate signals are sequentially applied to the display panel DP.

The data driving unit DD receives the data driving control signal DCS and the converted image data signal DAT from the timing control unit TC. The data driving unit DD generates a plurality of data signals based on the data driving control signal DCS and the converted image data signal DAT. The plurality of data signals are applied to the display panel DP.

The display panel DP may externally receive an electric signal, thus displaying an image. The display panel DP includes a plurality of gate lines GL1 to GLn, a plurality of data lines DL1 to DLm insulated from and intersecting the plurality of gate lines GL1 to GLn, and a plurality of pixels PX electrically connected to the plurality of gate lines GL1 to GLn and the plurality of data lines DL1 to DLm.

Each of the gate lines GL1 to GLn may extend along a first direction D1 and may be arranged along a second direction D2 that intersects the first direction D1. The gate lines GL1 to GLn sequentially receive the gate signals from the gate driving unit GD.

Each of the data lines DL1 to DLm may extend along the second direction D2 and may be arranged along the first direction D1. The data lines DL1 to DLm receive the data signal from the data driving unit DD.

The display panel DP may receive a first power voltage ELVDD and a second power voltage ELVSS from the outside. Each of the pixels PX may be turned on in response to a corresponding gate signal. Each of the pixels PX receives the first power voltage ELVDD and the second power voltage ELVSS and may generate a light in response to a corresponding data signal. The first power voltage ELVDD may have a higher voltage level than that of the second power voltage ELVSS.

The pixels PX according to the first example embodiment are depicted as being arranged in a matrix, but example embodiments are not limited thereto. The pixel PX may be connected to corresponding one of the gate lines GL1 to GLn and may be connected to corresponding one of the data lines DL1 to DLm.

Each of the pixels PX may receive a gate signal from corresponding one of the gate lines GL1 to GLn and receive a data signal from corresponding one of the data lines DL1 to DLm. Each of the pixels PX may be turned on in response to a corresponding gate signal. Each of the pixels PX may generate a light corresponding to a corresponding data signal, thus displaying an image.

The pixels PX may represent various colors, and in the first example embodiment, each pixel PX emits one of a red light, a green light, and a blue light. Hereinafter, a pixel emitting a red light is referred to as a red pixel, a pixel emitting a green light is referred to as a green pixel, and a pixel emitting a blue light is referred to as a blue pixel. In addition, the red pixel, the green pixel, and the blue pixel are at a red pixel area, a green pixel area, and a blue pixel area, respectively.

Figure 2:
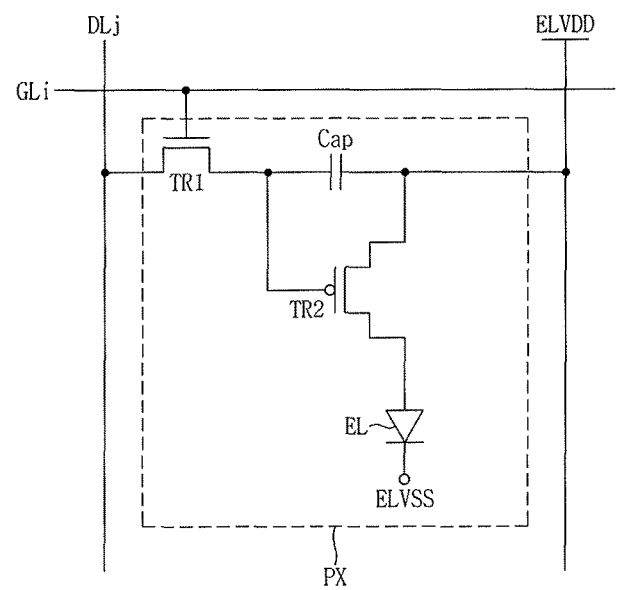
FIG. 2 illustrates an equivalent circuit diagram illustrating a pixel illustrated in FIG. 1.

FIG. 2 is an equivalent circuit diagram illustrating an example of a pixel in FIG. 1.

In the present example embodiment, referring to FIG. 2, a pixel PX is connected to an i-th gate line GLi of the plurality of gate lines GL1 to GLn and a j-th data line DLj of the plurality of data lines DL1 to DLm.

Referring to FIG. 2, the pixel PX includes a first transistor TR1, a second transistor TR2, a capacitor Cap, and an OLED EL. Thus, the OLED display device 10 according to the first example embodiment may be an active matrix type organic light emitting diode ("AMOLED") display device having a 2Tr-1Cap structure in which each pixel PX includes two transistors and one capacitor. However, example embodiments are not limited thereto, and the OLED display device 10 may include, for example, three or more transistors and two or more capacitors in one pixel, and may have various structures including additional wirings.

The first transistor TR1 may include a control electrode connected to the gate line GLi, an input electrode connected to the data line DLj, and an output electrode. The first transistor TR1 may output a data signal flowing through the data line DLj in response to the gate signal applied to the gate line GLi.

The capacitor Cap may include a first capacitor electrode connected to the first transistor TR1 and a second capacitor electrode receiving the first power voltage ELVDD. The capacitor Cap may charge an amount of electric charge corresponding to a difference between a voltage corresponding to the data signal applied from the first transistor TR1 and the first power voltage ELVDD.

The second transistor TR2 may include a control electrode connected to the output electrode of the first transistor TR1 and a first capacitor electrode of the capacitor Cap, an input electrode receiving the first power voltage ELVDD, and an output electrode. The output electrode of the second transistor TR2 may be electrically connected to the OLED EL.

In the present example embodiment, the second transistor TR2 may control a driving current flowing through the OLED EL in accordance with the amount of electric charge stored in the capacitor Cap. A turn-on time of the second transistor TR2 may be determined based on an amount of electric charge charged in the capacitor Cap. The output electrode of the second transistor TR2 may apply a voltage having a voltage level substantially lower than that of the first power voltage ELVDD to the OLED EL.

The OLED EL is connected to the second transistor TR2 and receives the second power voltage ELVSS. The OLED EL may emit light during a turn-on period of the second transistor TR2.

The organic light emitting device EL may include a light emitting material. The OLED EL may generate a light of a color corresponding to the light emitting material. The color of the light generated in the OLED EL may be, for example, red, green, or blue. Detailed descriptions of the OLED EL will be described below.

Figure 3:
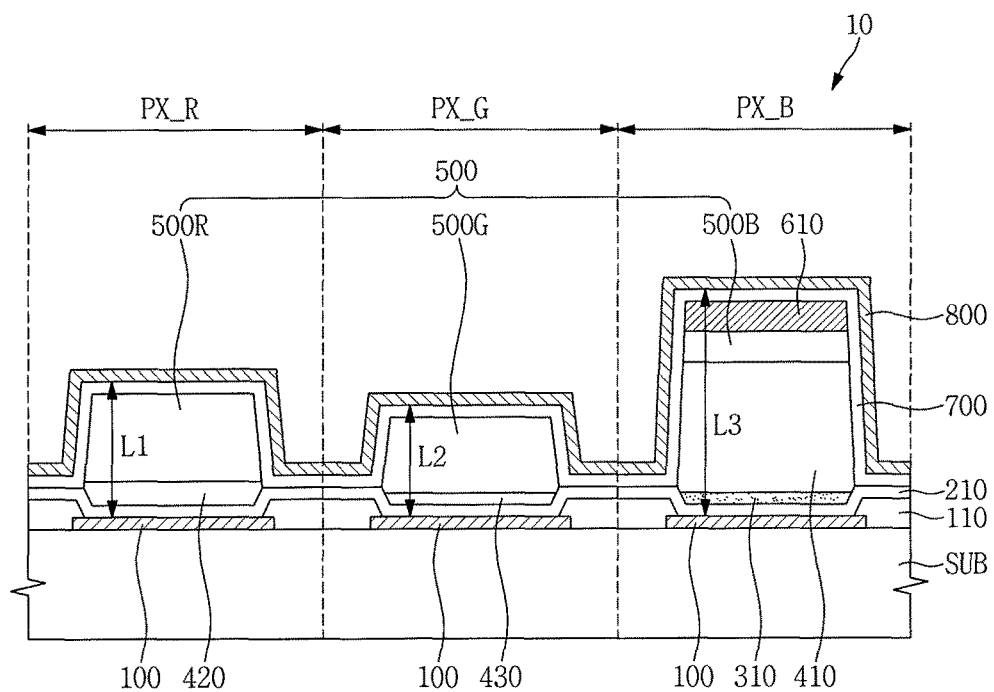
FIG. 3 illustrates a cross-sectional view illustrating an OLED display device according to the first example embodiment.

FIG. 3 is a cross-sectional view illustrating the OLED display device 10 according to the first example embodiment.

FIG. 3 illustrates an example of the OLED display device 10 at a red pixel area PX_R, a green pixel area PX_G, and a blue pixel area PX_B.

In FIG. 3, a base substrate and components between the base substrate and a first electrode 100 are omitted for ease of description. Hereinafter, for conciseness, the base substrate and components between the base substrate and the first electrode 100 will be referred to as a substrate SUB.

Referring to FIG. 3, the OLED display device 10 according to the first example embodiment includes the substrate SUB, the first electrode 100, a pixel defining layer 110, a hole transport layer 210, a first charge generation layer 310, first, second, and third resonance auxiliary layers 410, 420, and 430, a light emission portion 500, a first buffer layer 610, an electron transport layer 700, and a second electrode 800. The first electrode 100, the hole transport layer 210, the first charge generation layer 310, the first, second and third resonance auxiliary layers 410, 420 and 430, the light emission portion 500, the first buffer layer 610, the electron transport layer 700, and the second electrode 800 may be collectively referred to as an OLED EL (see FIG. 2).

The substrate SUB may include the base substrate, the first transistor TR1 (see FIG. 2), the second transistor TR2 (see FIG. 2), the capacitor Cap (see FIG. 2), and a plurality of insulating layers.

In the present example embodiment, a respective first electrode 100 is disposed at each of the red pixel area PX_R, the green pixel area PX_G, and the blue pixel area PX_B on the substrate SUB. The first electrode 100 may be connected to the second transistor TR2. For example, the first electrode 100 may be electrically conductive and electrically connected to the second transistor TR2 through a through hole.

The first electrode 100 may be, for example, a pixel electrode or an anode. The first electrode 100 may include, for example, a material having a high work function to facilitate hole injection, and may include a conductive material. In addition, the first electrode 100 may be a transmissive electrode, a transflective electrode, or a reflective electrode.

In the case where the first electrode 100 is a transmissive electrode, the first electrode 100 may include a transparent metal oxide such as indium tin oxide (ITO), indium zinc oxide (IZO), zinc oxide (ZnO), and indium tin zinc oxide (ITZO). In the case where the first electrode 100 is a transflective electrode or a reflective electrode, the first electrode 100 may include, for example, Ag, Mg, Al, Pt, Pd, Au, Ni, Nd, Ir, Cr, or a metal mixture. However, example embodiments are not limited thereto, and the first electrode 100 may include various materials based on the structure of the OLED EL.

The first electrode 100 may be a multilayer structure having a single layer or a plurality of layers including a transparent metal oxide or a metal. For example, the first electrode 100 may have a monolayer structure of ITO, Ag or a metal mixture (e.g., a mixture of Ag and Mg), a double layer structure of ITO/Mg or ITO/MgF, or a triple layer structure of ITO/Ag/ITO.

In the present example embodiment, the pixel defining layer 110 is disposed on the substrate SUB including the first electrode 100. The pixel defining layer 110 may be an insulating layer, and may define a light emission area and may partially overlap the first electrode 100.

The pixel defining layer 110 may include, for example, an organic insulating material such as a silicon-based material, an inorganic insulating material, or an organic-inorganic composite insulating material.

The hole transport layer 210 is on the first electrode 100 and the pixel defining layer 110. The hole transport layer 210 may be an area through which holes injected from the first electrode 100 pass to reach the light emission portion 500.

The hole transport layer 210 may include, for example, a carbazole-based derivative such as N-phenylcarbazole and polyvinylcarbazole, a fluorine-based derivative, N,N'-bis(3-methylphenyl)-N,N'-diphenyl-[1,1-biphenyl]-4,4'-diamine (TPD), a triphenylamine derivative such as 4,4',4''-tris(N-carbazolyl)triphenylamine) (TCTA), N,N'-di(1-naphthyl)-N,N'diphenylbenzidine (NPB), and/or 4,4'-cyclohexylidene bis[N,N-bis(4-methylphenyl)benzenamine] (TAPC), for example. However, example embodiments are not limited thereto.

The hole transport layer 210 may be formed using various methods such as a vacuum deposition method, a spin coating method, a cast method, a Langmuir-Blodgett (LB) method, an inkjet printing method, a laser printing method, and a laser induced thermal imaging (LITI) method.

The light emission portion 500 is disposed on the hole transport layer 210. The light emission portion 500 may have a monolayer structure including a single material, a monolayer structure including a plurality of different materials, or a multilayer structure including a plurality of layers including a plurality of different materials.

The light emission portion 500 may be formed using various methods such as a vacuum deposition method, a spin coating method, a cast method, a Langmuir-Blodgett (LB) method, an inkjet printing method, a laser printing method, and a laser induced thermal imaging (LITI) method.

The light emission portion 500 may include respective layers that have, for example, a material emitting a red light, a green light, and a blue light, and may include, for example, a fluorescent material or a phosphorescent material. In addition, a material included in the light emission portion 500 is not particularly limited, and the light emission portion 500 may include a host material and a dopant material.

For example, examples of the host material may include, for example, tris(8-hydroxyquinolino)aluminum (Alq3), 4,4'-bis(N-carbazolyl)-1,1'-biphenyl (CBP), poly(n-vinylcabazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethylbiphenyl (CDBP), and 2-methyl-9,10-bis(naphthalen-2-yl) anthracene (MADN), for example.

In the present example embodiment, the light emission portion 500 includes a red light emitting layer 500R, a green light emitting layer 500G, and a blue light emitting layer 500B. The red light emitting layer 500R is disposed at the red pixel area PX_R, the green light emitting layer 500G is disposed at the green pixel area PX_G, and the blue light emitting layer 500B is disposed at the blue pixel area PX_B.

The red light emitting layer 500R emits a red light. For example, the red light emitting layer 500R may include, for example a fluorescent material including PBD Eu(DBM)$_3$ (Phen) (tris(dibenzoylmethanato)phenanthroline europium) or perylene. In addition, the red light emitting layer 500R may include, for example, as a dopant material, at least one selected from the group of: an organometallic complex or a metal complex, such as PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium), and PtOEP(octaethylporphyrin platinum). However, example embodiments are not limited thereto.

The green light emitting layer 500G emits a green light. For example, the green light emitting layer 500G may include a fluorescent material including tris(8-hydroxyquinolino) aluminum (Alq3). In addition, the green light emitting layer 500G may include, for example, as a dopant material, at least one selected from the group of: an organometallic complex or a metal complex, such as Ir(ppy)$_3$ (fac-tris(2-phenylpyridine)iridium). However, example embodiments are not limited thereto.

The blue light emitting layer 500B emits a blue light. For example, the blue light emitting layer 500B may include a fluorescent material selected from the group of: spiro-DPVBi, spiro-6P, distyryl-benzene (DSB), and distyryl-arylene (DSA), a polyfluorene (PFO)-based polymer and a poly(p-phenylene vinylene) (PPV)-based polymer. In addition, the blue light emitting layer 500B may include, for example, as a dopant material, at least one selected from the group of: an organometallic complex or a metal complex, such as (4,6-F2ppy)$_2$Irpic. However, example embodiments are not limited thereto.

In the present example embodiment, the first charge generation layer 310 and the first, second, and third resonance auxiliary layers 410, 420, and 430 are disposed between the hole transport layer 210 and the light emission portion 500. For example, the first charge generation layer 310 and the first resonance auxiliary layer 410 are sequentially disposed between the hole transport layer 210 and the blue emission layer 500B of the blue pixel area PX_B, the second resonance auxiliary layer 420 is disposed between the hole transport layer 210 and the red light emitting layer 500R of the pixel area PX_R, and the third resonance auxiliary layer 430 is disposed between the hole transport layer 210 of the green light emitting layer 500G of the green pixel area PX_G. The first, second, and third resonance auxiliary layers 410, 420, and 430 may adjust a distance between the first electrode 100 and the second electrode 800.

The OLED display device 10 according to the present example embodiment has a multilayer stack structure. Thus, a light emitted from the light emission portion 500 passes through the multilayer structure to be emitted outwards. When optical resonance occurs between two layers, the energy of light increases, and the light having increased energy may easily pass through the multilayer structure to be emitted outwards. Such a structure allowing a light to resonate between two layers is called a resonance structure, and a distance between two layers where resonance occurs is called a resonance distance. The resonance distance depends on the wavelength of a light. The ideal resonance distance may vary depending on the wavelength of the light emitted from the light emitting unit 500.

In the present example embodiment, the resonance distances of the red pixel area PX_R, the green pixel area PX_G, and the blue pixel area PX_B may be adjusted by using the first, second, and third resonance auxiliary layers 410, 420, and 430, respectively. For example, a distance between the first electrode 100 and the second electrode 800 may be set to be N times (N being a natural number) of ½ of a wavelength of a light to be resonated. For example, in the present example embodiment, the number N may be selected such that N=1 (a primary resonance) in the case of the red and green pixels, and N=2 (a secondary resonance) in the case of the blue pixel. In the present example embodiment, a thickness of the first resonance auxiliary layer 410 at the blue pixel area PX_B is greater than thicknesses of the second and third resonance auxiliary layers 420 and 430 at the red and green pixel areas PX_R and PX_G.

Light emitted from the red light emitting layer 500R has a longer wavelength than that of a light emitted from the green light emitting layer 500G. In the present example embodiment, a thickness of the second resonance auxiliary layer 420 at the red pixel area PX_R is greater than a thickness of the third resonance auxiliary layer 430 at the green pixel area PX_G.

For example, as illustrated in FIG. 3, when a distance between the first electrode 100 and the second electrode 800 at the red pixel area PX_R is defined as a first distance L1, a distance between the first electrode 100 and the second electrode 800 at the green pixel area PX_G is defined as a second distance L2, and a distance between the first electrode 100 and the second electrode 800 at the blue pixel area PX_B is defined as a third distance L3, the first distance L1 is greater than the second distance L2 and less than the third distance L3 (L2<L1<L3). The distances may be determined from inner surfaces of the respective electrodes. In an implementation, the first distance L1 may be in a range of, for example, about 1000 Å to about 1200 Å, the second distance L2 may be in a range of, for example, about 800 Å to about 1000 Å, and the third distance L3 may be in a range of, for example, about 1700 Å to about 1900 Å.

The first, second, and third resonance auxiliary layers 410, 420, and 430 may use an auxiliary layer material which is generally used in the art. For example, each of the first, second, and third resonance auxiliary layers 410, 420, and 430 may include a material such as SiN, SiO, $TiO_2$, $Ta_2O_5$, ITO, IZO, and the like for adjusting the optical resonance distance. In addition, each of the first, second, and third resonance auxiliary layers 410, 420, and 430 may further include a metal or an alloy such as Ag, MgAg, and the like.

In the present example embodiment, the first charge generation layer 310 is disposed between the hole transport layer 210 and the first resonance auxiliary layer 410 at the blue pixel area PX_B. The first charge generation layer 310 may be, for example, a p-type doped layer. The first charge generation layer 310 may be formed by doping the first resonance auxiliary layer 410 with a p-type dopant. For example, the p-type dopant may be one of a quinone derivative, a metal oxide, and a compound including a cyano group. The p-type dopant may be a quinone derivative such as tetracyanoquinodimethane (TCNQ) and 2,3,5,6-tetra-fluoro-tetracyanoquinodimethane (F4-TCNQ) and/or a metal oxide such as a tungsten oxide and a molybdenum oxide, but example embodiments are not limited thereto. When the first charge generation layer 310 is a p-type doped layer, the first charge generation layer 310 may have a thickness in a range of, for example, about 30 Å to about 100 Å.

In an implementation, the first charge generation layer 310 may include, for example, 1,4,5,8,9,11-hexaazatriphenylene-hexacarbonitrile (HAT-CN). In the case where the first charge generation layer 310 includes HAT-CN, the first charge generation layer 310 may have a thickness in a range of, for example, about 30 Å to about 800 Å. However, example embodiments are not limited thereto.

A hole injection barrier at the blue pixel area PX_B may be lowered by the first charge generation layer 310. In addition, the first charge generation layer 310 may be spaced apart from the blue light emitting layer 500B such that dissipation of excitons generated in the blue light emitting layer 500B may be substantially prevented. Accordingly, a driving voltage of the OLED EL may be lowered at the blue pixel area PX_B, and light emission efficiency of a blue light may be improved.

In a manufacturing process of an OLED display device, a shadow phenomenon may occur. For example, materials forming the second and third resonance auxiliary layers 420 and 430 and the red and green light emitting layers 500R and 500G may permeate to an edge portion of the blue pixel area PX_B. In such a case, when the first charge generation layer 310 is not provided, color abnormality or a color mixture may occur at the edge portion of the blue pixel area PX_B due to a leakage current. In the OLED display device 10 according to the first example embodiment, the first charge generation layer 310 may be included and, although the shadow phenomenon may occur, occurrence of color abnormality or a color mixture at the edge portion of the blue pixel area PX_B may be substantially prevented. Accordingly, display quality of the OLED display device 10 may be improved.

In the present example embodiment, the electron transport layer 700 is disposed on the light emission portion 500. The electron transport layer 700 may be an area through which electrons injected from the second electrode 800 pass to reach the light emission portion 500.

The electron transport layer 700 may include, for example, tris(8-hydroxyquinolinato) aluminum (Alq3), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate) (Bebq2), 9,10-di(naphthalene-2-yl)anthracene (AND), and a mixture thereof. However, example embodiments are not limited thereto.

In addition, the OLED display device 10 according to the first example embodiment may further include an electron injection layer on the electron transport layer 700. When the OLED display device 10 includes the electron transport layer 700 and the electron injection layer, the electron transport layer 700 may include, for example, a lanthanum metal, such as LiF, lithium quinolate (LiQ), $Li_2O$, BaO, NaCl, CsF, and Yb, or a halogenated metal, such as RbCl and RbI, for example. In addition, the electron injection layer may include, for example, a mixture of an electron transporting material and an insulating organometallic salt. The organometallic salt may be, for example, a material having an energy band gap of about 4 eV or more. For example, the organometallic salt may include metal acetate, metal benzoate, metal acetoacetate, metal acetylacetonate, or metal stearate.

The electron transport layer 700 may be formed using various methods such as a vacuum deposition method, a spin coating method, a cast method, a Langmuir-Blodgett (LB)

method, an inkjet printing method, a laser printing method, and a laser induced thermal imaging (LITI) method.

In the present example embodiment, the first buffer layer 610 is disposed between the blue light emitting layer 500B and the electron transport layer 700. The first buffer layer 610 may be, for example, a hole blocking layer and may include, for example, a material having a highest occupied molecular orbital (HOMO) level of about −5.7 eV or less. The first buffer layer 610 according to the first example embodiment may have a thickness in a range of, for example, about 30 Å to about 100 Å in consideration of the process margin.

The first buffer layer 610 may include, for example, at least one selected from the group of: Yb, Mg, Li, Na, Ca, Sr, Ba, In, Sn, La, Ce, Pr, Nd, Pm, Eu, Gd, Tb, Dy, Ho, Er, Sm, and Lu. In addition, the first buffer layer 610 may include, for example, a metal alloy that includes at least one of Yb, Mg, Li, Na, Ca, Sr, Ba, In, Sn, La, Ce, Pr, Nd, Pm, Eu, Gd, Tb, Dy, Ho, Er, Sm, and Lu and at least one of Ag, Al, Mg, Cr, Mn, Fe, Co, Ni, Cu, In, Sn, Ru, Mo, and Nb. However, example embodiments are not limited thereto.

The OLED display device 10 according to the first example embodiment includes the first buffer layer 610 at the blue pixel area PX_B. Thus, light emission efficiency of a blue light may be improved due to the hole blocking effect. However, example embodiments are not limited thereto, and the first buffer layer 610 may be omitted.

According to the present example embodiment, the second electrode 800 is on the electron transport layer 700. The second electrode 800 may be a common electrode or a cathode. The second electrode 800 may be electrically conductive and may include, for example, a material having a low work function to facilitate electron injection.

The second electrode 800 may be a monolayer structure or a multilayer structure. In the case of a multilayer structure, the second electrode 800 may include, for example, at least one of: a layer including a reflective material and a layer including a transmissive material. The second electrode 800 may be a reflective electrode, a transflective electrode, or a transmissive electrode. However, example embodiments are not limited thereto, and the second electrode 800 may include various materials based on the structure of the OLED EL.

In the case where the second electrode 800 is a transmissive electrode, the second electrode 800 may include, for example, Li, Ca, LiF/Ca, LiF/Al, Al, Mg, BaF, Ba, Ag, or a compound or a mixture thereof (e.g., a mixture of Ag and Mg). The second electrode 800 may include an auxiliary electrode. The auxiliary electrode may include a layer formed by depositing the above-describe material to face the light emitting layer and a transparent metal oxide, such as indium tin oxide (ITO), indium zinc oxide (IZO), zinc oxide (ZnO), indium tin zinc oxide (ITZO), Mo, and Ti, on the layer.

In the case where the second electrode 800 is a transflective electrode or a reflective electrode, the second electrode 800 may include, for example, Ag, Mg, Al, Pt, Pd, Au, Ni, Nd, Ir, Cr, Li, Ca, LiF/Ca, LiF/Al, Mo, Ti or a compound or a mixture thereof (e.g., a mixture of Ag and Mg). In addition, the second electrode 800 may have a multilayer structure including a reflective layer or a transflective layer including the above-described material and a transparent conductive layer including indium tin oxide (ITO), indium zinc oxide (IZO), zinc oxide (ZnO), and indium tin zinc oxide (ITZO), A capping layer may further be disposed on the second electrode 800. The capping layer may have a refractive index in a range of, for example, about 1.8 to about 2.4.

Figure 4:
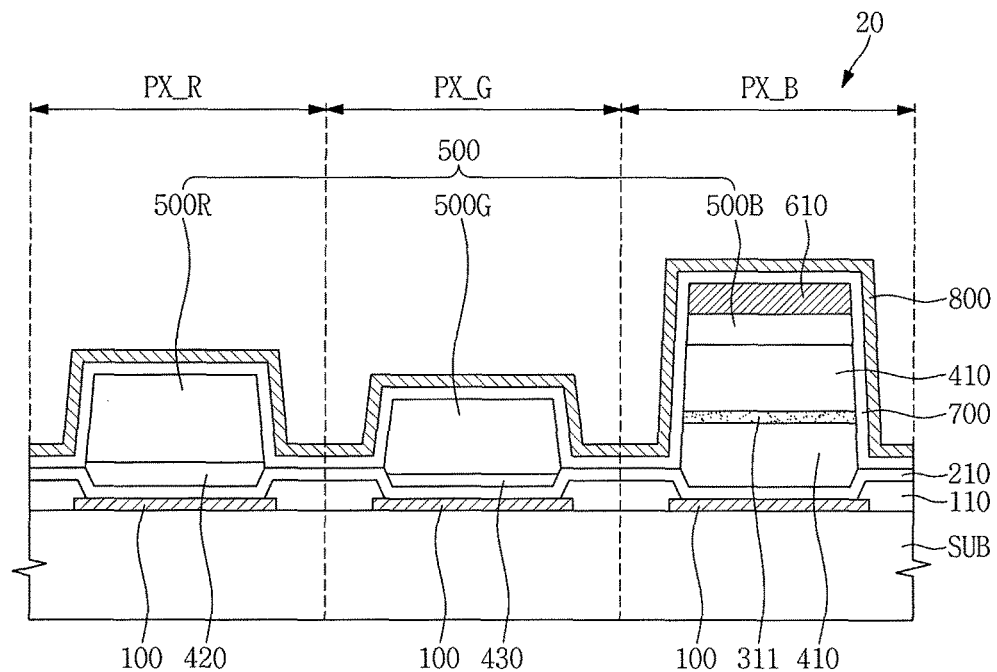
FIG. 4 illustrates a cross-sectional view illustrating an OLED display device according to a second example embodiment.

FIG. 4 is a cross-sectional view illustrating an OLED display device 20 according to a second example embodiment. The descriptions of the same configuration as that of the first example embodiment will be omitted for ease of description.

Referring to FIG. 4, the OLED display device 20 according to the second example embodiment includes a substrate SUB, a first electrode 100, a pixel defining layer 110, a hole transport layer 210, a first charge generation layer 311, first, second, and third resonance auxiliary layers 410, 420, and 430, a light emission portion 500, a first buffer layer 610, an electron transport layer 700 and a second electrode 800.

The first charge generation layer 311 according to the second example embodiment does not contact the hole transport layer 210 at a blue pixel area PX_B. For example, as illustrated in FIG. 4, the first charge generation layer 311 may have a shape inserted into the first resonance auxiliary layer 410 in a sectional view.

The first charge generation layer 311 may be, for example, a p-type doped layer. The first charge generation layer 311 may be formed by, for example, doping the first resonance auxiliary layer 410 with a p-type dopant. For example, the p-type dopant may be one of a quinone derivative, a metal oxide, and a compound including a cyano group. The p-type dopant may be a quinone derivative such as tetracyanoquinodimethane (TCNQ) and 2,3,5,6-tetrafluoro-tetracyanoquinodimethane (F4-TCNQ) and/or a metal oxide such as a tungsten oxide and a molybdenum oxide, but example embodiments are not limited thereto. When the first charge generation layer 311 is a p-type doped layer, the first charge generation layer 311 may have a thickness in a range of, for example, about 30 Å to about 100 Å.

In an implementation, the first charge generation layer 311 may include, for example, 1,4,5,8,9,11-hexaazatriphenylene-hexacarbonitrile (HAT-CN). In the case where the first charge generation layer 311 includes HAT-CN, the first charge generation layer 311 may have a thickness in a range of, for example, about 30 Å to about 800 Å.

The first charge generation layer 311 according to the second example embodiment is depicted as having a shape inserted into a central portion of the first resonance auxiliary layer 410, but example embodiments are not limited thereto. If the first charge generation layer 311 contacts the blue light emitting layer 500B, excitons generated in the blue light emitting layer 500B may be dissipated at the first charge generation layer 311 and light emission efficiency of a blue light may decrease. In the present example embodiment, the first charge generation layer 311 may be formed in an area not in contact with the blue light emitting layer 500B.

Figure 5:
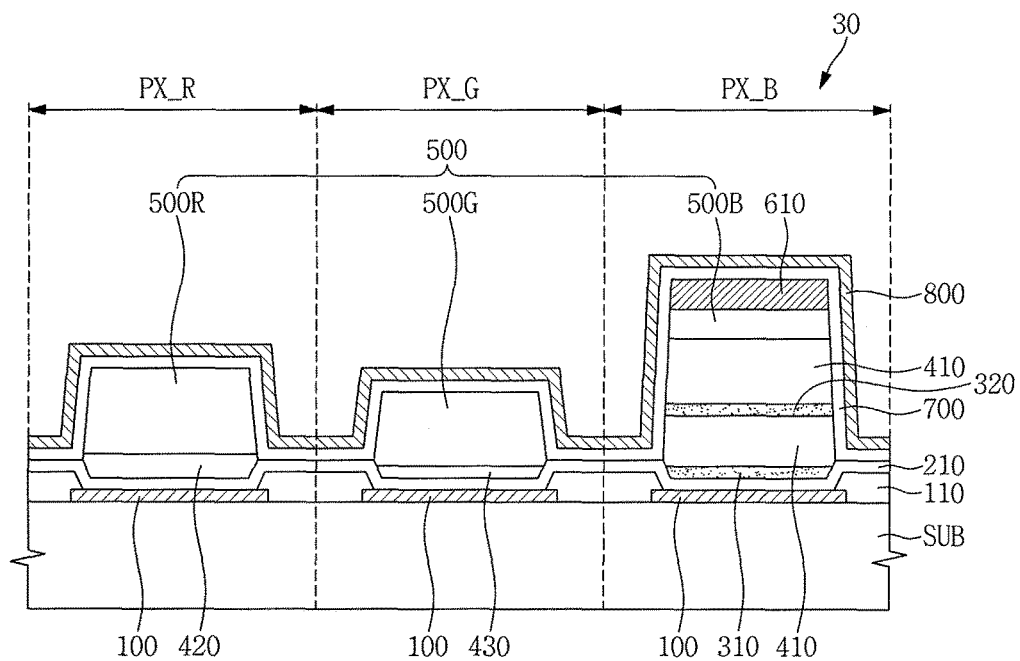
FIG. 5 illustrates a cross-sectional view illustrating an OLED display device according to a third example embodiment.

FIG. 5 is a cross-sectional view illustrating an OLED display device 30 according to a third example embodiment. The descriptions of the same configuration as that of the first example embodiment will be omitted for ease of description.

Referring to FIG. 5, the OLED display device 30 according to the third example embodiment includes a substrate SUB, a first electrode 100, a pixel defining layer 110, a hole transport layer 210, first and second charge generation layers 310 and 320, first, second, and third resonance auxiliary layers 410, 420, and 430, a light emission portion 500, a first buffer layer 610, an electron transport layer 700, and a second electrode 800.

The first charge generation layer 310 according to the third example embodiment is disposed to contact the hole transport layer 210 of the blue pixel area PX_B.

The first charge generation layer 310 may be, for example, a p-type doped layer. The first charge generation layer 310 may be formed by, for example, doping the first resonance auxiliary layer 410 with a p-type dopant. For example, the p-type dopant may be one of a quinone derivative, a metal oxide, and a compound including a cyano group. The p-type dopant may be a quinone derivative such as tetracyanoquinodimethane (TCNQ) and 2,3,5,6-tetrafluoro-tetracyanoquinodimethane (F4-TCNQ) and/or a metal oxide such as a tungsten oxide and a molybdenum oxide, but example embodiments are not limited thereto. When the first charge generation layer 310 is a p-type doped layer, the first charge generation layer 310 may have a thickness in a range of, for example, about 30 Å to about 100 Å.

In an implementation, the first charge generation layer 310 may include, for example, 1,4,5,8,9,11-hexaazatriphenylene-hexacarbonitrile (HAT-CN). In the case where the first charge generation layer 310 includes HAT-CN, the first charge generation layer 310 may have a thickness in a range of, for example, about 30 Å to about 800 Å.

The OLED display device 30 according to the third example embodiment includes the first charge generation layer 310 in contact with the hole transport layer 210. Thus, even if the shadow phenomenon occurs, occurrence of color abnormality or a color mixture at the edge portion of the blue pixel area PX_B may be substantially prevented. Accordingly, display quality of the OLED display device 30 may be improved.

The second charge generation layer 320 is between the first charge generation layer 310 and the blue light emitting layer 500B. For example, as illustrated in FIG. 5, the second charge generation layer 320 may have a shape inserted into the first resonance auxiliary layer 410 in a sectional view.

The second charge generation layer 320 may include a substantially same material as or a different material from a material included in the first charge generation layer 310. For example, when the first charge generation layer 310 is a p-type doped layer, the second charge generation layer 320 may be a p-type doped layer doped with a substantially same p-type dopant as that of the first charge generation layer 310 or, dissimilar to the first charge generation layer 310, may include, for example, 1,4,5,8,9,11-hexaazatriphenylene-hexacarbonitrile (HAT-CN). In an implementation, when the first charge generation layer 310 includes 1,4,5,8,9,11-hexaazatriphenylene-hexacarbonitrile (HAT-CN), the second charge generation layer 320 may include, for example, 1,4,5,8,9,11-hexaazatriphenylene-hexacarbonitrile (HAT-CN) similar to the first charge generation layer 310, or, dissimilar to the first charge generation layer 310, may be a p-type doped layer. In addition, when the first charge generation layer 310 and the second charge generation layer 320 are p-type doped layers, the doping concentrations of the first charge generation layer 310 and the second charge generation layer 320 may be different from each other. However, example embodiments are not limited thereto, and the first and second charge generation layers 310 and 320 may be variously modified.

Further, although the OLED display device 30 according to the third example embodiment is depicted as including two charge generation layers 310 and 320, example embodiments are not limited thereto. The OLED display device 30 may include, for example, three or more charge generation layers.

The OLED display device 30 according to the third example embodiment further includes the second charge generation layer 320. Thus, the driving voltage of the OLED EL at the blue pixel area PX_B may be further reduced. Accordingly, light emission efficiency of a blue light may be improved.

Figure 6:
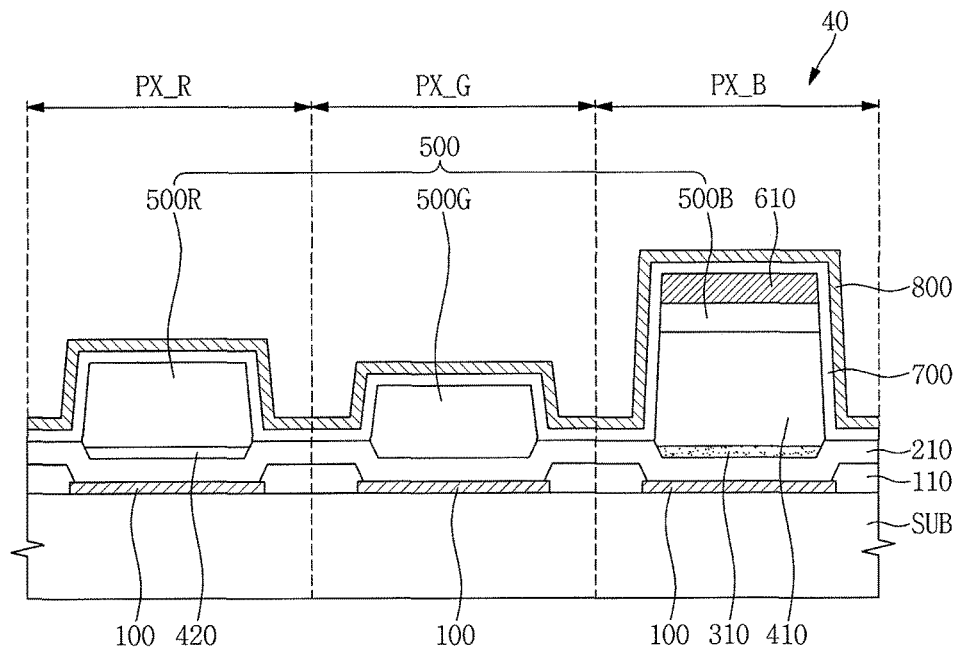
FIG. 6 illustrates a cross-sectional view illustrating an OLED display device according to a fourth example embodiment.

FIG. 6 is a cross-sectional view illustrating an OLED display device 40 according to a fourth example embodiment. The descriptions of the same configuration as that of the first example embodiment will be omitted for ease of description.

Referring to FIG. 6, the OLED display device 40 according to the fourth example embodiment includes a substrate SUB, a first electrode 100, a pixel defining layer 110, a hole transport layer 210, a first charge generation layer 310, first and second resonance auxiliary layers 410 and 420, a light emission portion 500, a first buffer layer 610, an electron transport layer 700, and a second electrode 800.

The hole transport layer 210 according to the fourth example embodiment is formed to have a greater thickness as compared to that of the first example embodiment. The third resonance auxiliary layer 430 for adjusting a resonance distance of the green pixel area PX_G may be omitted.

The hole transport layer 210 may include, for example, a carbazole-based derivative such as N-phenylcarbazole or polyvinylcarbazole, a fluorine-based derivative, N,N'-bis(3-methylphenyl)-N,N'-diphenyl-[1,1-biphenyl]-4,4'-diamine (TPD), a triphenylamine derivative such as 4,4',4"-tris(N-carbazolyl)triphenylamine) (TCTA), N,N'-di(1-naphthyl)-N,N'diphenylbenzidine (NPB), and/or 4,4'-cyclohexylidene bis[N,N-bis(4-methylphenyl)benzenamine] (TAPC), but example embodiments are not limited thereto. A thickness of the hole transport layer 210 may be in a range of, for example, about 50 Å to about 500 Å.

The OLED display device 40 according to the fourth example embodiment does not include the third resonance auxiliary layer. Thus, the manufacturing process may be simplified.

Figure 7:
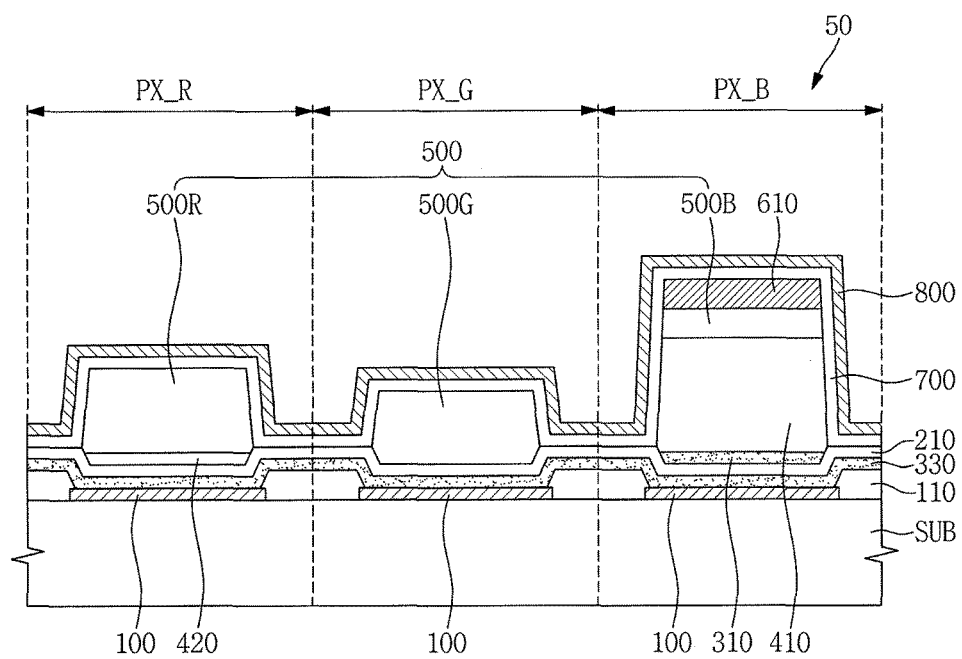
FIG. 7 illustrates a cross-sectional view illustrating an OLED display device according to a fifth example embodiment.

FIG. 7 is a cross-sectional view illustrating an OLED display device 50 according to a fifth example embodiment. The descriptions of the same configuration as that of the first example embodiment will be omitted for ease of description.

Referring to FIG. 7, the OLED display device 50 according to the fifth example embodiment includes a substrate SUB, a first electrode 100, a pixel defining layer 110, a hole transport layer 210, first and third charge generation layers 310 and 330, first and second resonance auxiliary layers 410 and 420, a light emission portion 500, a first buffer layer 610, an electron transport layer 700, and a second electrode 800. The OLED display device 50 according to the fifth example embodiment further includes the third charge generation layer 330.

The third charge generation layer 330 is disposed on the first electrode 100 and the pixel defining layer 110. For example, as illustrated in FIG. 7, the third charge generation layer 330 may contact the first electrode 100 and the pixel defining layer 110, and may be disposed over an entire surface of the substrate SUB.

The third charge generation layer 330 may be, for example, a p-type doped layer. The third charge generation layer 330 may be formed by, for example, doping the hole transport layer 210 with a p-type dopant. For example, the p-type dopant may be one of a quinone derivative, a metal oxide, and a compound including a cyano group. The p-type dopant may be a quinone derivative such as tetracyanoquinodimethane (TCNQ) and 2,3,5,6-tetrafluoro-tetracyanoquinodimethane (F4-TCNQ) and/or a metal oxide such as a tungsten oxide and a molybdenum oxide, but example embodiments are not limited thereto. When the third charge generation layer 330 is a p-type doped layer, the third charge generation layer 330 may have a thickness in a range of, for example, about 30 Å to about 100 Å.

In an implementation, the third charge generation layer 330 may include, for example, 1,4,5,8,9,11-hexaazatriphenylene-hexacarbonitrile (HAT-CN). In the case where the third charge generation layer 330 includes HAT-CN, the third charge generation layer 330 may have a thickness in a range of, for example, about 30 Å to about 800 Å.

The hole transport layer 210 is disposed over an entire surface of the substrate SUB on the third charge generation layer 330. The hole transport layer 210 may be an area through which holes injected from the first electrode 100 and the third charge generation layer 330 pass to reach the light emission portion 500.

The OLED display device 50 according to the fifth example embodiment includes the third charge generation layer 330. Thus, a larger amount of holes may reach the light emission portion 500 and thus light emission efficiency of a blue light may be improved.

Figure 8:
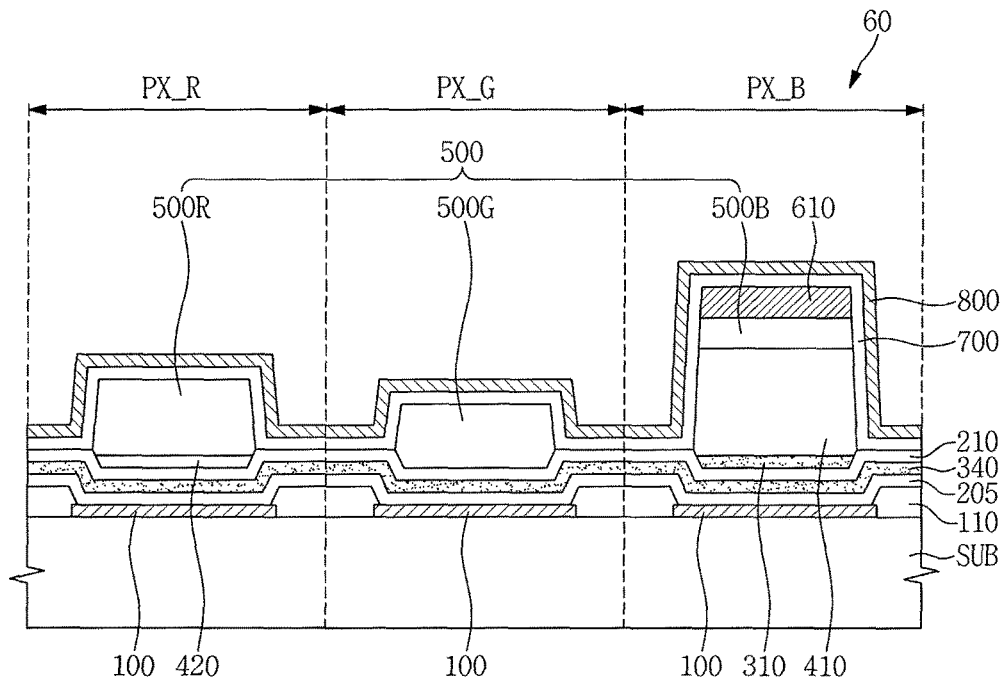
FIG. 8 illustrates a cross-sectional view illustrating an OLED display device according to a sixth example embodiment.

FIG. 8 is a cross-sectional view illustrating an OLED display device 60 according to a sixth example embodiment. The descriptions of the same configuration as that of the first example embodiment will be omitted for ease of description.

Referring to FIG. 8, the OLED display device 60 according to the sixth example embodiment includes a substrate SUB, a first electrode 100, a pixel defining layer 110, a hole injection layer 205, a hole transport layer 210, first and fourth charge generation layers 310 and 340, first and second resonance auxiliary layers 410 and 420, a light emission portion 500, a first buffer layer 610, an electron transport layer 700 and a second electrode 800. The OLED display device 60 according to the sixth example embodiment further includes the hole injection layer 205 and the fourth charge generation layer 340.

The hole injection layer 205 is on the first electrode 100 and the pixel defining layer 110. For example, as illustrated in FIG. 8, the hole injection layer 205 may contact the first electrode 100 and the pixel defining layer 110, and may be disposed over an entire surface of the substrate SUB.

The hole injection layer 205 may include, for example, a phthalocyanine compound such as copper phthalocyanine, polyaniline/dodecylbenzenesulfonic acid (PANI/DBSA), 4,4',4"-tris{N,-(2-naphthyl)-N-phenylamino}-triphenylamine (2TNATA), 4,4',4"-tris(3-methylphenylphenylamino)triphenylamine (m-MTDATA), 4,4',4"-tris(N,N-diphenylamino)triphenylamine (TDATA), polyaniline/camphor sulfonic acid (PANI/CSA), (polyaniline)/poly(4-styrenesulfonate) (PANI/PSS), N,N'-diphenyl-N,N'-bis-[4-(phenyl-m-tolyl-amino)-phenyl]-biphenyl-4,4'-diamine (DNTPD), and poly(3,4-ethylenedioxythiophene)/poly(4-styrenesulfonate) (PEDOT/PSS), for example. However, example embodiments are not limited thereto. A thickness of the hole injection layer 205 may be in a range of, for example, about 1 Å to about 100 Å.

The fourth charge generation layer 340 is disposed on the hole injection layer 205.

The fourth charge generation layer 340 may be a p-type doped layer. The fourth charge generation layer 340 may be formed by, for example, doping the hole transport layer 210 with a p-type dopant. For example, the p-type dopant may be one of a quinone derivative, a metal oxide, and a compound including a cyano group. The p-type dopant may be a quinone derivative such as tetracyanoquinodimethane (TCNQ) and 2,3,5,6-tetrafluoro-tetracyanoquinodimethane (F4-TCNQ) and/or a metal oxide such as a tungsten oxide and a molybdenum oxide, but example embodiments are not limited thereto. When the fourth charge generation layer 340 is a p-type doped layer, the fourth charge generation layer 340 may have a thickness in a range of, for example, about 30 Å to about 100 Å.

In an implementation, the fourth charge generation layer 340 may include, for example, 1,4,5,8,9,11-hexaazatriphenylene-hexacarbonitrile (HAT-CN). In the case where the fourth charge generation layer 340 includes HAT-CN, the fourth charge generation layer 340 may have a thickness in a range of, for example, about 30 Å to about 800 Å.

The hole transport layer 210 is disposed over an entire surface of the substrate SUB on the fourth charge generation layer 340. The hole transport layer 210 may be an area through which holes injected from the first electrode 100 and the fourth charge generation layer 340 pass to reach the light emission portion 500.

The OLED display device 60 according to the sixth example embodiment includes the hole injection layer 205 and the fourth charge generation layer 340. Thus, a larger amount of holes may reach the light emission portion 500 and thus light emission efficiency of a blue light may be improved.

Figure 9:
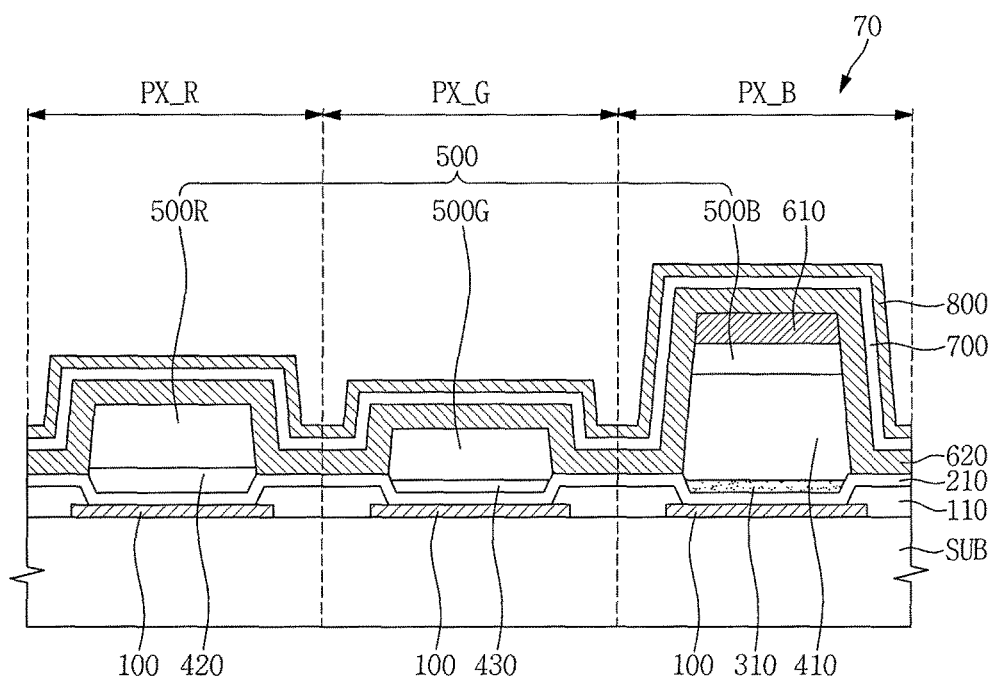
FIG. 9 illustrates a cross-sectional view illustrating an OLED display device according to a seventh example embodiment.

FIG. 9 is a cross-sectional view illustrating an OLED display device 70 according to a seventh example embodiment. The descriptions of the same configuration as that of the first example embodiment will be omitted for ease of description.

Referring to FIG. 9, the OLED display device 70 according to the seventh example embodiment includes a substrate SUB, a first electrode 100, a pixel defining layer 110, a hole transport layer 210, a first charge generation layer 310, first, second, and third resonance auxiliary layers 410, 420, and 430, a light emission portion 500, first and second buffer layers 610 and 620, an electron transport layer 700, and a second electrode 800. The OLED display device 70 according to the seventh example embodiment further includes the second buffer layer 620.

The second buffer layer 620 contacts the hole transport layer 210, the light emission portion 500, and the first buffer layer 610, and may be disposed over an entire surface of the substrate SUB. In addition, the second buffer layer 620 may at partially contact the first resonance auxiliary layer 410 and the second resonance auxiliary layer 420. The second buffer layer 620 may be a hole blocking layer and may include, for example, a material having a highest occupied molecular orbital (HOMO) level of about −5.7 eV or less. The second buffer layer 620 according to the seventh example embodiment may have a thickness in a range of, for example, about 30 Å to about 100 Å in consideration of the process margin.

The second buffer layer 620 may include, for example, at least one selected from the group of: Yb, Mg, Li, Na, Ca, Sr, Ba, In, Sn, La, Ce, Pr, Nd, Pm, Eu, Gd, Tb, Dy, Ho, Er, Sm, and Lu. In addition, the second buffer layer 620 may include, for example, a metal alloy including at least one of Yb, Mg, Li, Na, Ca, Sr, Ba, In, Sn, La, Ce, Pr, Nd, Pm, Eu, Gd, Tb, Dy, Ho, Er, Sm, and Lu and at least one of Ag, Al, Mg, Cr, Mn, Fe, Co, Ni, Cu, In, Sn, Ru, Mo, and Nb. In addition, the second buffer layer 620 may include a substantially same material as or a different material from a material included in the first buffer layer 610. However, example embodiments are not limited thereto, and the second buffer layer 620 may include various materials.

The OLED display device 70 according to the seventh example embodiment includes the second buffer layer 620 at red, green, and blue pixel areas PX_R, PX_G, and PX_B. Thus, light emission efficiency of the OLED display device 70 may be improved due to a hole blocking effect.

By way of summation and review, an OLED display device may have a multilayer structure including an OLED. Light emitted from the OLED may be dissipated by, for example, total reflection in the process of being emitted outwards, which may reduce light emission efficiency. Further, when forming the multilayer structure of the OLED, color abnormality or a color mixture may occur due to a shadow phenomenon.

As described above, embodiments may provide to an organic light emitting diode display device improved in terms of light emission efficiency and display quality.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. An organic light emitting diode display device, comprising:
    a substrate including a red pixel area, a green pixel area, and a blue pixel area;
    a respective first electrode at each of the red pixel area, the green pixel area, and the blue pixel area on the substrate;
    a hole transport layer on the first electrode;
    a light emission portion on the hole transport layer, the light emission portion including a red light emitting layer at the red pixel area, a green light emitting layer at the green pixel area, and a blue light emitting layer at the blue pixel area;
    a first charge generation layer and a first resonance auxiliary layer between the hole transport layer and the blue light emitting layer;
    a second resonance auxiliary layer between the hole transport layer and the red light emitting layer;
    an electron transport layer on the light emission portion; and
    a second electrode on the electron transport layer,
    wherein a distance between the first electrode and the second electrode at the blue pixel area is greater than a distance between the first electrode and the second electrode at the red and green pixel areas.

2. The organic light emitting diode display device as claimed in claim 1, wherein the distance between the first electrode and the second electrode at the red pixel area is in a range of about 1000 Å to about 1200 Å, the distance between the first electrode and the second electrode at the green pixel area is in a range of about 800 Å to about 1000 Å and the distance between the first electrode and the second electrode at the blue pixel area is in a range of about 1700 Å to about 1900 Å.

3. The organic light emitting diode display device as claimed in claim 1, further comprising a third resonance auxiliary layer between the hole transport layer and the green light emitting layer.

4. The organic light emitting diode display device as claimed in claim 1, wherein the first charge generation layer contacts the hole transport layer.

5. The organic light emitting diode display device as claimed in claim 4, further comprising a second charge generation layer between the first charge generation layer and the blue light emitting layer.

6. The organic light emitting diode display device as claimed in claim 1, wherein the first charge generation layer does not contact the hole transport layer.

7. The organic light emitting diode display device as claimed in claim 1, wherein the first charge generation layer has a thickness in a range of about 30 Å to about 800 Å.

8. The organic light emitting diode display device as claimed in claim 1, wherein the first charge generation layer is a p-type doped layer.

9. The organic light emitting diode display device as claimed in claim 1, wherein the first charge generation layer includes 1,4,5,8,9,11-hexaazatriphenylene-hexacarbonitrile.

10. The organic light emitting diode display device as claimed in claim 1, further comprising a third charge generation layer between the first electrode and the hole transport layer.

11. The organic light emitting diode display device as claimed in claim 1, further comprising a hole injection layer between the first electrode and the hole transport layer.

12. The organic light emitting diode display device as claimed in claim 11, further comprising a fourth charge generation layer between the hole injection layer and the hole transport layer.

13. The organic light emitting diode display device as claimed in claim 1, further comprising a first buffer layer between the blue light emitting layer and the electron transport layer.

14. The organic light emitting diode display device as claimed in claim 13, wherein the first buffer layer has a thickness in a range of about 30 Å to about 100 Å.

15. The organic light emitting diode display device as claimed in claim 13, further comprising a second buffer layer between the red light emitting layer and the electron transport layer, between the green light emitting layer and the electron transport layer, and between the first buffer layer and the electron transport layer.

* * * * *